(12) United States Patent
Choi et al.

(10) Patent No.: US 8,241,927 B2
(45) Date of Patent: Aug. 14, 2012

(54) METHODS RELATING TO CAPACITIVE MONITORING OF LAYER CHARACTERISTICS DURING BACK END-OF-THE-LINE PROCESSING

(75) Inventors: Jihong Choi, Fishkill, NY (US); Yongsik Moon, Paramus, NJ (US); Roderick Augur, Hopewell Junction, NY (US); Eden Zielinski, Wappingers Falls, NY (US)

(73) Assignee: Global Foundries, Inc., Grand Cayman (KY)

( * ) Notice: Subject to any disclaimer, the term of this patent is extended or adjusted under 35 U.S.C. 154(b) by 360 days.

(21) Appl. No.: 12/579,216

(22) Filed: Oct. 14, 2009

(65) Prior Publication Data

US 2011/0086445 A1    Apr. 14, 2011

(51) Int. Cl.
*H01L 21/66* (2006.01)

(52) U.S. Cl. ... 438/17; 257/529; 257/773; 257/E21.531; 257/774; 438/667

(58) Field of Classification Search ......... None
See application file for complete search history.

(56) References Cited

U.S. PATENT DOCUMENTS

| | | | |
|---|---|---|---|
| 5,382,911 A * | 1/1995 | Cotler et al. | 324/662 |
| 6,633,172 B1 * | 10/2003 | Doemens et al. | 324/661 |
| 2005/0088770 A1 * | 4/2005 | Saliba et al. | 360/71 |
| 2007/0190940 A1 * | 8/2007 | Lee et al. | 455/41.2 |
| 2008/0153182 A1 * | 6/2008 | Herchen et al. | 438/10 |
| 2008/0157268 A1 * | 7/2008 | Kim et al. | 257/529 |
| 2009/0067094 A1 * | 3/2009 | Hayek et al. | 360/234.7 |

* cited by examiner

*Primary Examiner* — Mamadou Diallo
(74) *Attorney, Agent, or Firm* — Ingrassia Fisher & Lorenz, P.C.

(57) ABSTRACT

Methods are provided that relate to the capacitive monitoring of characteristic pertaining to layer formed during the back end-of-the-line (BEOL) processing of a semiconductor device. In one embodiment, a method includes the steps of forming a first capacitor array including first and second overlying contacts each formed in a different one of the plurality of BEOL layers, measuring the interlayer capacitance between the first and second overlying contacts, and converting the measured interlayer capacitance to a distance between the first and second overlying contacts.

20 Claims, 6 Drawing Sheets

METHODS RELATING TO CAPACITIVE MONITORING OF LAYER CHARACTERISTICS DURING BACK END-OF-THE-LINE PROCESSING

TECHNICAL FIELD

The present invention relates generally to semiconductor device manufacturing processes and, more particularly, to methods pertaining to the monitoring of layers formed during back end-of-the-line processing.

BACKGROUND

During front end-of-the-line processing, a plurality of semiconductor devices (e.g., transistors, resistors, capacitors, and the like) are formed on a semiconductor wafer. During back end-of-the-line (BEOL) processing, the semiconductor devices are interconnected to form a plurality of integrated circuits on the wafer, which are subsequently separated into individual die during wafer dicing. Interconnection of the semiconductor devices is accomplished via the formation of a plurality of BEOL layers, which include, in part, a number of metallization layers and a number of intermetal dielectric layers. The BEOL layers are divided into a number of successive metal levels, with each metal level commonly formed utilizing a damascene or a dual damascene technique. For example, during a generalized damascene process utilized to form the $M_1$ metal level, an intermetal dielectric material (IMD) is first deposited over a previously deposited pre-metal dielectric layer; the IMD is etched to create a pattern therein; the pattern is filled with a conductive metal, such as copper; the excess copper is removed utilizing a chemical mechanical planarization (CMP) process to yield a number of metal interconnect lines within the IMD; and then an additional IMD (commonly referred as a "capping layer") is deposited over the patterned interconnect lines and previously-deposited IMD. Additional metal levels (e.g., the $M_2$ metal level, the $M_3$ metal level, etc.) are successively formed in a similar manner, with many conventional integrated circuits including up to twelve metal levels in total.

For process development reasons, it is often desirable to monitor characteristics pertaining to the layers formed during back-end-of-the-line (BEOL) processing. In current practice, at least two metrological methods are commonly employed to monitor BEOL layer thickness. Each metrological method is typically performed after chemical mechanical planarization and prior to formation of the capping layer. In the first commonly-employed method, an interferometer directs a beam of light through the IMD and against a relatively large (e.g., >50 microns), non-patterned metal pad (the "measurement pad") provided beneath the uppermost metal level. The light beam is reflected from the measurement pad, propagates back through the IMD, and is ultimately received by an optical receiver. The phase change between the ingoing and outgoing light waves is measured and utilized to estimate the thickness of the IMD overlying the measurement pad. By comparison, in the second commonly-employed metrological method, a scatterometer directs a beam of electromagnetic (e.g., microwave) energy against a lattice-like metal structure (commonly referred to as a "grating structure") formed within the IMD of the newly-formed metal level. When striking the grating structure, the beam scatters in relation to the depth of the grating structure. The degree to which the beam scatters is then measured and utilized to estimate the depth of the grating structure and, therefore, the depth of the metal interconnect lines within the measured metal level.

Each of the above-described metrological methods is limited in certain respects. For example, both the interferometer- and the scatterometer-based methods have limitations associated with reliability and accuracy. In addition, the performance of either of above-described metrological methods requires an independent metrological step and separate tool set; as a result, both metrological methods prolong the semiconductor fabrication process and incur undesirable CMP-to-capping time delay during which oxidation of the metal interconnect lines can occur. As a further disadvantage, the above-described metrological methods are generally incapable of measuring other potentially useful characteristics pertaining to the BEOL layers; in particular, both methods are generally incapable of measuring the dielectric constant at various locations across the BEOL layers, and the scatterometer-based method is further unable to measure IMD thickness. The interferometer-based method described above is also limited in several unique manners. For example, the CMP removal rate of the IMD overlying the measurement pad often differs from the removal of the IMD overlying the metal interconnect lines formed in the underlying metal level. Thus, the thickness of the IMD over the measurement pad is often not representative of the average IMD thickness over the measured metal level. Furthermore, to ensure sufficient reliability of interferometer-based measurements, the measurement pad may be required to have a minimum thickness that excludes usage in conjunction with 22 nanometer (nm) semiconductor nodes and below. As a still further disadvantage, the recent usage of ultra low-k IMD materials has enabled the thickness of metal interconnect lines to be decreased to dimensions that are difficult to accurately monitor utilizing interferometer-based methods. Finally, the optical characteristics (e.g., reflectivity index) of the ultra low-k IMD materials can also change due to chemical reaction with the slurry applied during CMP processing and thus introduce still further inaccuracies in interferometer-based measurements.

Considering the above, it is desirable to provide embodiments of a monitoring method suitable for monitoring one or more characteristics pertaining to layers formed during the back end-of-the-line processing of a semiconductor wafer, such as BEOL layer thickness, via over-etch depth, and/or dielectric constant variation across the wafer. Preferably, embodiments of such a monitoring method could be reliably performed utilizing existing in-line electrical test equipment thereby eliminating the need for a separate tool set and minimizing CMP-to-capping time delay. It would also be desirable for embodiments of such a monitoring method to be compatible with ultra low-k IMD materials and semiconductor nodes equal to or less than 22 nm. Other desirable features and characteristics of the present invention will become apparent from the subsequent detailed description and the appended Claims, taken in conjunction with the accompanying Drawings and the foregoing Technical Field and Background.

BRIEF SUMMARY

Embodiments of a method for monitoring at least one characteristic pertaining to a plurality of back end-of-the-line (BEOL) layers are provided. In one embodiment, the method includes the steps of forming a first capacitor array within the plurality of BEOL layers including first and second overlying contacts each formed in a different one of the plurality of BEOL layers, measuring the interlayer capacitance between the first and second overlying contacts, and converting the measured interlayer capacitance to a distance between the first and second overlying contacts.

Embodiments of a method for manufacturing a plurality of integrated circuits on a semiconductor wafer are further provided. In one embodiment, the method includes the steps of fabricating semiconductor devices on the semiconductor wafer, forming a plurality of back end-of-the-line (BEOL) layers interconnecting the semiconductor devices, and monitoring a first characteristic pertaining to the BEOL layers at a plurality of sites on the semiconductor wafer. The step of monitoring includes the sub-steps of forming first and second overlying contacts each in a different one of the plurality of BEOL layers, measuring the interlayer capacitance between the first and second overlying contacts, and converting the measured interlayer capacitance to a distance between the first and second overlying contacts.

Embodiments of a method for manufacturing an integrated circuit are still further provided. In one embodiment, the method includes the steps of providing a semiconductor wafer, fabricating semiconductor devices on the wafer, and forming a first plurality of back end-of-the-line (BEOL) layers interconnecting the semiconductor devices. The first plurality of BEOL layers is formed in accordance with a design parameter previously determined by steps including: (i) forming a second plurality of BEOL layers on test wafer; (ii) forming first and second overlying contacts each in a different one of the second plurality of BEOL layers; (iii) measuring the interlayer capacitance between the first and second overlying contacts; and (iv) converting the measured interlayer capacitance to a distance between the first and second overlying contacts;

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description. Various steps in the manufacture of semiconductor devices and back end-of-the-line layers are well-known and, in the interests of brevity, will only be mentioned briefly herein or will be omitted entirely without providing the well-known process details.

As appearing herein, the phrase "contact formed in a back end-of-the-line (BEOL) layer," the phrase "contact formed in a first metal level," and similar phrases are utilized to indicate that at least some portion of a contact (e.g., a filled trench or via) is formed in a specified BEOL layer or metal level; thus, such phrases do not preclude the contact being formed through the specified BEOL layer or metal level and extending into or through additional BEOL layers or metal levels. Furthermore, the term "overlying" is utilized to denote that some portion of a first contact (or other element) is positioned above or over at least some portion of a second contact (or other element). Similarly, the term "underlying" is utilized to denote that some portion of a first contact (or other element) is positioned beneath or under at least some portion of a second contact (or other element). The terms "overlying" and "underlying" are utilized to generally indicate relative position and, thus, do not indicate direct contact between overlying or underlying elements.

Figure 1:
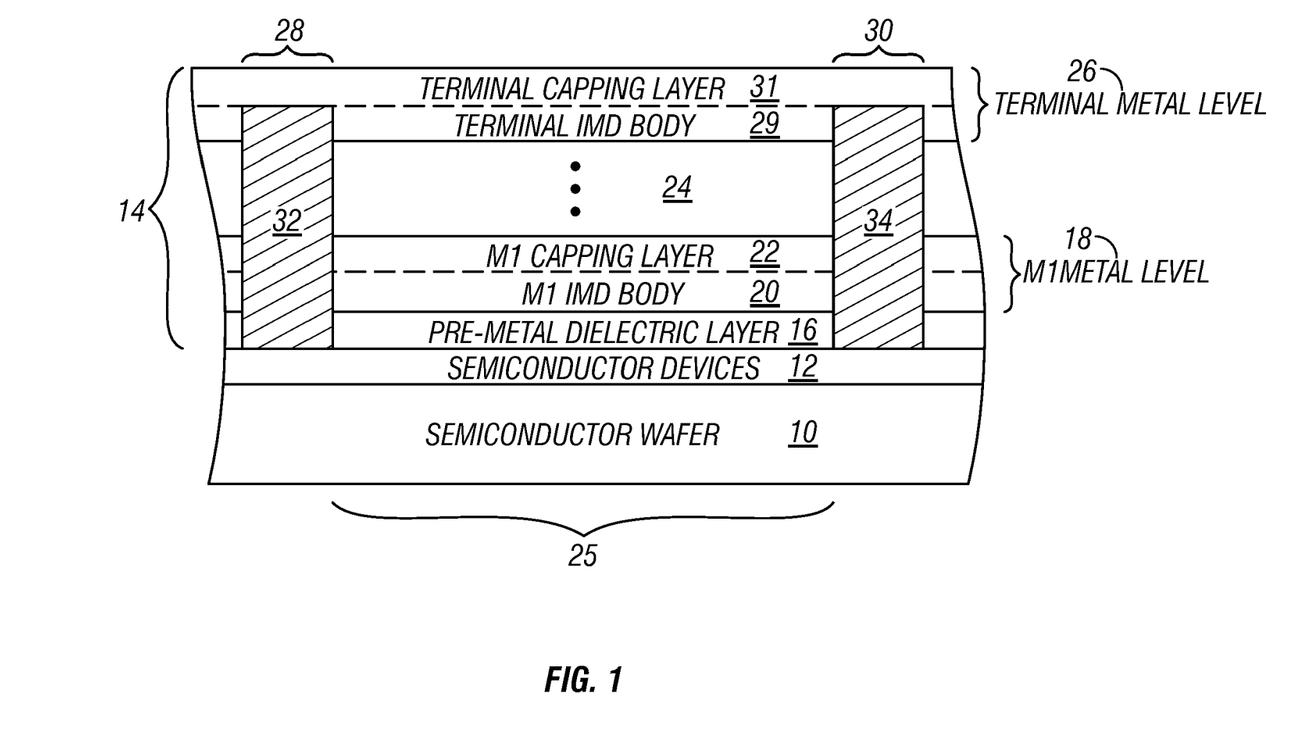
FIG. 1 is simplified cross-sectional view of a semiconductor wafer including first and second capacitor arrays formed in a plurality of layers formed during back end-of-the-line (BEOL) processing in accordance with an exemplary embodiment.

FIG. 1 is a generalized cross-sectional view of an exemplary semiconductor wafer 10 having a plurality of semiconductor devices 12 formed thereon (wafer 10 is partially shown in FIG. 1 and not drawn to scale). Wafer 10 can be a bulk silicon wafer, a silicon-on-insulator (SOI) wafer, or any other silicon-comprising substrate on which semiconductor devices 12 can be formed. Semiconductor devices 12 are interconnected by a number of layers 14. Layers 14 are formed during back end-of-the-line (BEOL) processing of wafer 10 and are consequentially referred to herein as BEOL layers 14. BEOL layers 14 include a pre-metal dielectric (PMD) layer 16 initially formed over semiconductor devices 12. An $M_1$ metal level 18 is subsequently formed over PMD layer 16 and includes several BEOL layers. As indicated above, $M_1$ metal level 18 is conveniently formed utilizing a damascene or dual damascene process wherein a first layer of inter-metal dielectric (IMD) material (identified in FIG. 1 as "$M_1$ IMD body 20") is deposited over PMD layer 16 and etched to create a pattern therein. A conductive material, such as copper, is then deposited into the pattern. The excess copper is removed utilizing a chemical mechanical planarization (CMP) process to yield a number of metal interconnect lines within IMD body 20 (not shown in FIG. 1 for clarity). Finally, a second layer of IMD (identified in FIG. 1 as "capping layer 22") is deposited over the patterned interconnect lines and IMD body 20. As indicated in FIG. 1 at 24, additional metal levels are then sequentially formed, as appropriate, concluding with the formation of the final or terminal metal level 26. As does $M_1$ metal level 18, terminal metal level 26 includes an IMD body 29 patterned to include metal interconnect lines (not shown) and an overlying capping layer 31. Although not shown in FIG. 1 for clarity, BEOL layers 14 will typically include additional layers that are conventionally known in the semiconductor industry; e.g., a passivation layer formed over terminal metal level 26, and various additional layers (e.g., barrier films, plug layers, adhesion films, etc.) included within each metal level.

The portion of semiconductor wafer 10 illustrated in FIG. 1 includes a single die 25, which is separated from the other die included within wafer 10 (not shown) during wafer dicing.

Wafer dicing can be accomplished utilizing any suitable method, such as scribing and breaking, mechanical sawing, or laser cutting. As a more specific example, a dicing saw can be utilized to make several linear cuts, and thus effectively remove, selected portions of wafer 10 surrounding die 25. The linear areas along which wafer 10 may be cut or scribed during the dicing process are commonly referred to as "dicing streets," and the linear areas removed from wafer 10 during dicing are commonly referred to as "kerf areas." Two such kerf areas 28 and 30 are shown in FIG. 1 and extend along opposing sides of die 25. As will be readily appreciated, the layout of the circuit formed on die 25 is typically such that all active components (i.e., semiconductor devices 12) are separated from the kerf areas by a predetermined minimum distance to avoid damage during dicing.

It is desirable to monitor various characteristics pertaining to BEOL layers 14, such as layer thickness, during BEOL processing. Although certain metrology methods are currently utilized to monitor layer thickness, such metrology methods typically require a separate tool set, incur CMP-to-capping time delay, and are generally subject to inaccuracies and other limitations as described in the Background above. In addition, conventional metrological methods and tool sets of the type described above are typically incapable of measuring dielectric constants at different locations across a wafer. To overcome these limitations, an exemplary embodiment of an BEOL layer monitoring method is described below in conjunction with FIGS. 2-6. Pursuant to the BEOL layer monitoring method, at least one capacitor array is formed within BEOL layers 14 during BEOL processing. Although a single capacitor can be formed within BEOL layers 14 and utilized to implement embodiments of the monitoring method, it is preferred that multiple capacitor arrays are formed at different locations to monitor the uniformity of one or more characteristics across wafer 10, such as the uniformity of layer thickness. In embodiments wherein the capacitor arrays are utilized in circuit production (as opposed to process development), the capacitor arrays are preferably formed, at least partially, within the kerf areas to maximize the area available for functional circuitry. For example, as illustrated generically by cross-hatching in FIG. 1, first and second capacitor arrays 32 and 34 can be formed within kerf areas 28 and 30 of wafer 10, respectively.

Figure 2:
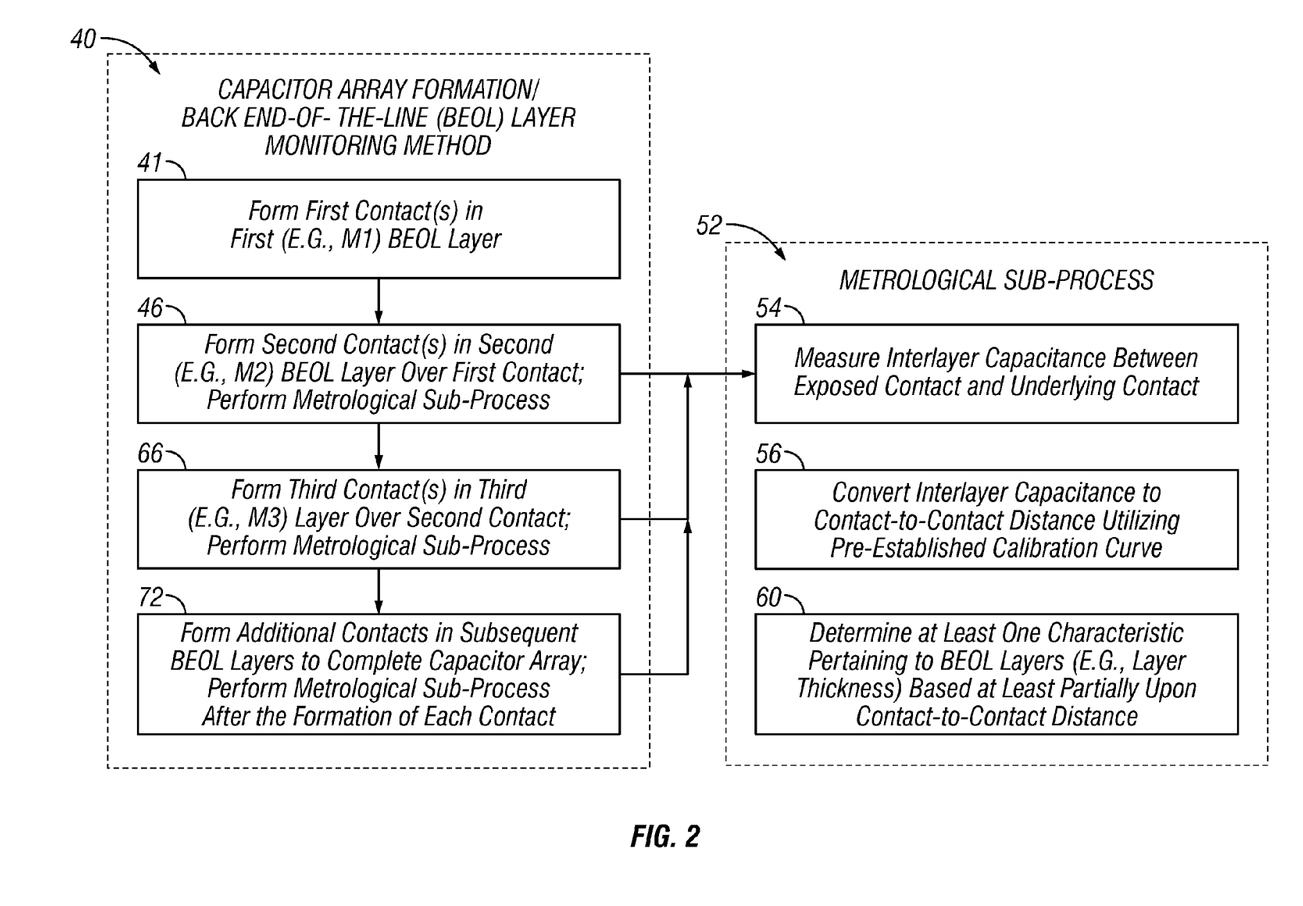
FIG. 2 is a flowchart illustrating an exemplary BEOL layer monitoring method that can be performed during fabrication of the BEOL layers illustrated in FIG. 1.
Figure 3:
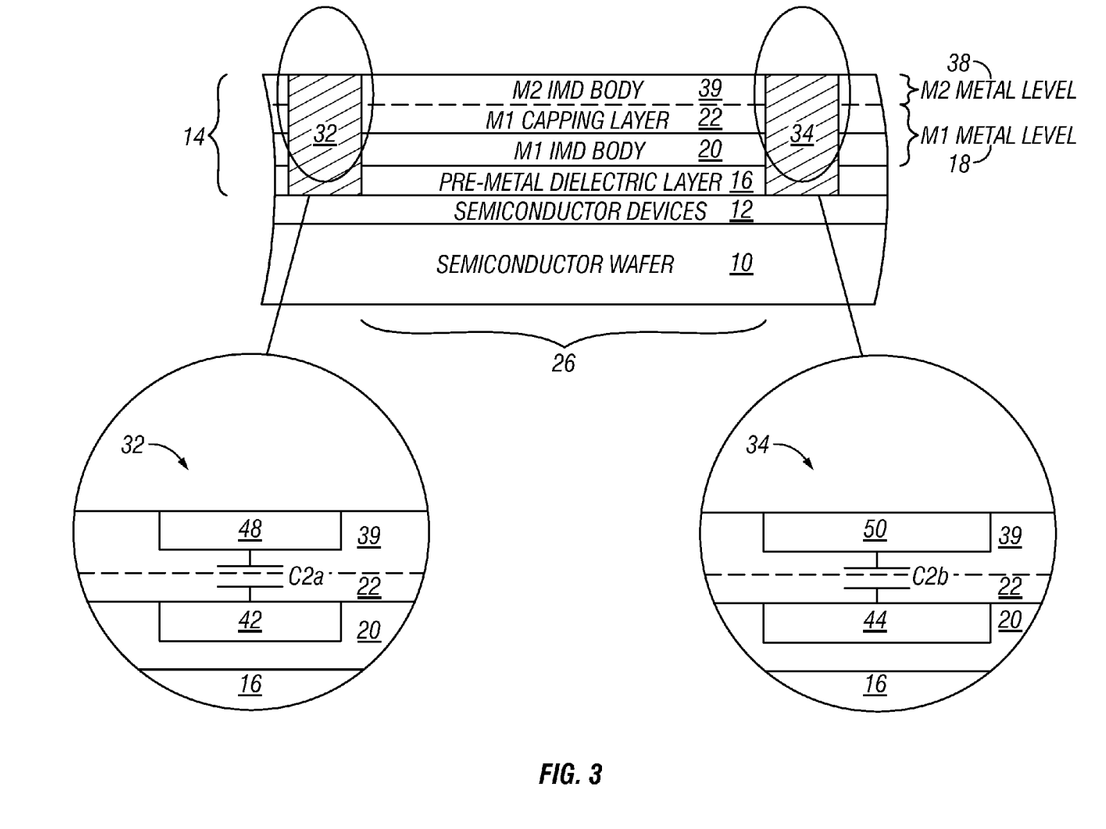
FIG. 3 is a simplified cross-sectional view of the semiconductor wafer shown in FIG. 1 after the formation of the metal interconnect lines included within the $M_2$ metal level and illustrating the first and second capacitor arrays in greater detail (shown in a partially completed state)

FIG. 2 is a flowchart illustrating an exemplary BEOL layer monitoring method 40 that can be performed during back end-of-the-line processing of semiconductor wafer 10 to monitor one or more characteristics pertaining to BEOL layers 14 (FIG. 1). As indicated above, first and second capacitor arrays 32 and 34 can be formed at selected locations within BEOL layers 14 pursuant to monitoring method 40. FIG. 3 is a simplified cross-sectional view of semiconductor wafer 10 after the partial formation of a $M_2$ metal level 38 over $M_1$ capping layer 22 and illustrating partially-completed capacitor arrays 32 and 34 in greater detail. It will be noted that, in FIG. 3, $M_2$ metal level 38 is illustrated after chemical mechanical planarization and prior to capping. Thus, in FIG. 3, a first IMD layer (identified as "$M_2$ IMD body 39") has been deposited over $M_1$ metal level 18, and metal interconnect lines (not shown) have been formed in $M_2$ IMD body 39 via patterning, metal deposition, and CMP processing as previously described.

Referring collectively to FIGS. 1-3, monitoring method 40 commences with the formation of at least a first contact in $M_1$ metal level 18 (STEP 41, FIG. 2). For example, with reference to FIG. 3, a first trench 42 in capacitor array 32 and a first trench 44 in capacitor array 34 can each be formed in $M_1$ IMD body 20 of $M_1$ metal level 18 during STEP 41. Trenches 42 and 44 are filled with a conductive material (e.g., copper) and can be formed utilizing any suitable process, including damascene processes of the type described above. For this reason, trenches 42 and 44, and similar trenches, will each be referred to herein a "filled trench." It is, however, emphasized that the phrase "filled trench" and similar phrases, as appearing herein, are utilized only to indicate that a conductive material (e.g., copper) has been deposited within a space or void created in an insulative material (e.g., an intermetal dielectric) in a quantity sufficient to form a capacitively-coupled contact of the type described herein; thus, the phrase "filled trench" and similar phrases do not indicate that the entire volume of the space or void formed within the IMD is necessarily filled with the conductive material. After the formation of $M_1$ IMD body 20, the formation of trenches 42 and 44, and the filling of filled trenches 42 and 44, $M_1$ capping layer 22 is formed over $M_1$ IMD body 18 as generally shown in FIG. 3.

Next, at STEP 46 of monitoring method 40 (FIG. 2), at least a second contact is formed in $M_2$ metal level 38 overlying the first contact; e.g., as shown in FIG. 3, a second filled trench 48 in capacitor array 32 can be formed in $M_2$ IMD body 39 overlying first filled trench 42 during STEP 46 (note that both $M_2$ IMD body 39 and second filled trench 48 overlie first filled trench 42). A second filled trench 50 in capacitor array 34 can also be formed in $M_2$ IMD body 39 overlying first filled trench 44 during STEP 46 (again, note that both $M_2$ IMD body 39 and second filled trench 50 overlie first filled trench 45). Each filled trench in capacitor array 32 is preferably formed to have substantially equivalent dimensions and, more specifically, substantially equivalent upper and lower surface areas. Similarly, each filled trench in capacitor array 34 is preferably formed to have substantially equivalent upper and lower surface areas. The dimensions of the filled trenches included within array 32 may be substantially identical to the dimensions of the trenches included within array 34; however, it is preferred that the predetermined trench dimensions, and in particular the upper and lower surface areas, of capacitor array 32 and of capacitor array 34 are disparate to enable the variance in dielectric constant between arrays 32 and 34 to be back calculated in the manner described below in conjunction with Equations 1-3.

With continued reference to exemplary monitoring method 40 illustrated in FIG. 2, a first iteration of a metrological sub-process 52 is performed subsequent to the formation filled trenches 48 and 50 in $M_2$ metal level 38 (STEP 46). Metrological sub-process 52 is preferably performed after the planarization of $M_2$ IMD body 39 and prior to formation of a capping layer over $M_2$ IMD body 39 and, therefore, prior to the completion of $M_2$ metal level 38. Metrological sub-process 52 is performed both for capacitor array 32 and for capacitor array 34; however, for ease of explanation, the following will primarily describe metrological sub-process 52 in conjunction with capacitor array 32. To commence metrological sub-process 52 (STEP 54, FIG. 2), the interlayer capacitance between the exposed contact and the underlying contact is measured; thus, in the exemplary case of capacitor array 32, the interlayer capacitance between filled trench 48 and filled trench 42 is measured (identified as "$C_{2a}$" in FIG. 3). The interlayer capacitance is conveniently measured utilizing existing in-line testing (ILT) equipment commonly utilized to test circuit functionality. As a specific example, during in-line testing, a first electrical probe is placed in contact with filled trench 48, a second electrical probe is place in contact with filled trench 42, and the capacitance between the probes is recorded. In this manner, the interlayer capacitance can be measured in-line during the ILT step and without the need for a separate metrology step or independent tool set, such as an interferometer or scatterometer. Notably, the parameters pertaining to the capacitance measurements between overlying contacts can be added to the preexisting in-line test code to further streamline the monitoring process.

Figure 4:
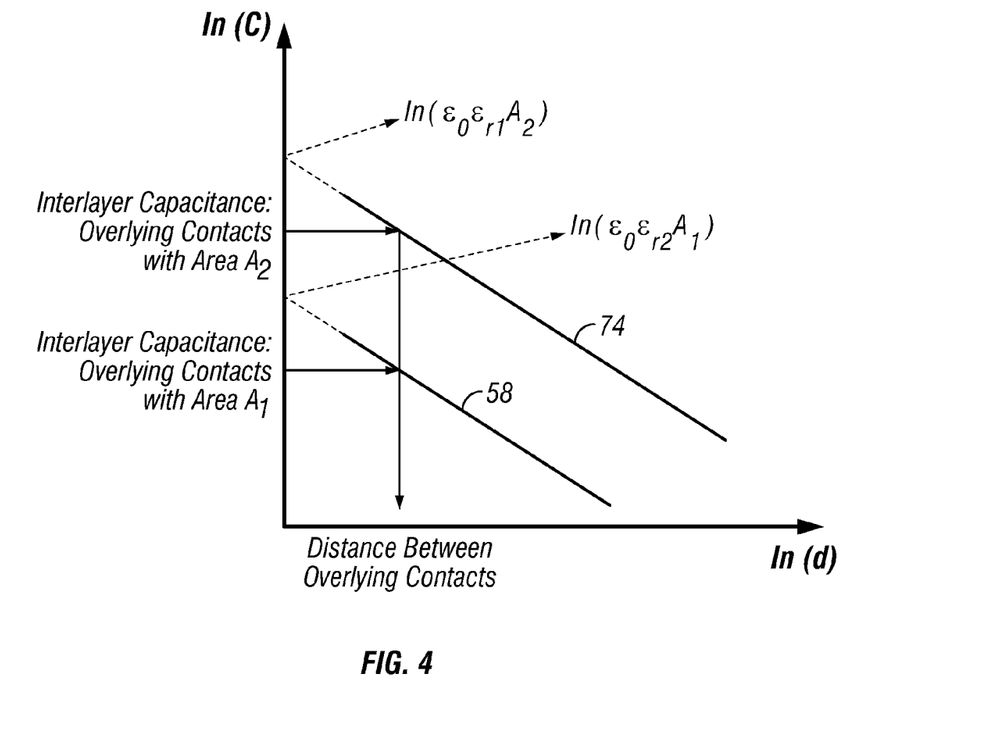
FIG. 4 is a graph illustrating interlayer capacitance (vertical axis) versus contact-to-contact distance (horizontal axis) including first and second calibration curves representative of overlying contacts in the first and second capacitor array, respectively.

Next, during STEP 56 of metrological sub-process 52, the interlayer capacitance measured during STEP 54 is converted to a contact-to-contact distance utilizing a calibration curve. The calibration curve is a pre-established function describing interlayer capacitance versus contact-to-contact distance for overlying contacts (e.g., filled trenches 48 and 42) included within capacitor array 32. FIG. 4 provides an example of a first calibration curve 58 that may be utilized to convert the interlayer capacitance ($C_{2a}$) to a distance between filled trenches 42 and 48. In this particular example, calibration curve 58 expresses the natural log of the interlayer capacitance (vertical axis) versus the natural log of the distance between first filled trench 42 and second filled trench 48 (horizontal axis). Although curve 58 can be generated utilizing any suitable method, calibration curve 58 is preferably generated in the following manner. First, a series of set-up experiments are performed wherein test wafers are fabricated including overlying contacts substantially identical to filled trenches 42 and 48 (e.g., filled trenches having dimensions substantially equivalent to trenches 42 and 48), but spaced apart over a range of known or measured distances. The distances between the overlying contacts can be controlled by planarizing each metal level to a desired thickness utilizing a CMP process and/or by measuring the spacing between overlying contacts utilizing a scanning electron microscope or other instrument. The interlayer capacitance between overlying contacts is then measured for each test wafer, and the resulting data (measured interlayer capacitance versus known contact-to-contact distance) is compiled to generate calibration curve 58. Notably, the conventionally-known processes utilized to form the capping layers in each test wafer are highly controllable; thus, the capping layer thickness can be held substantially constant for each test wafer and changes in capacitance can be attributed substantially entirely to variation in IMD thickness between overlying contacts. The resulting calibration curve is then utilized to convert the interlayer capacitance to a contact-to-contact distance during STEP 56 of metrological sub-process 52 (FIG. 2).

Advancing to STEP 60 of metrology sub-process 52 (FIG. 2), the contact-to-contact distance established during STEP 56 is utilized to determine at least one characteristic pertaining to BEOL layers 14. For example, with respect to capacitor array 32 (FIG. 3), the distance between the lower surface of filled trench 48 and the upper surface of filled trench 42 is representative of the cumulative thickness of $M_1$ capping layer 22 and the portion of IMD body 39 located beneath trench 48. As the thickness of $M_1$ capping layer 22 is substantially known, the thickness of the portion of IMD body 39 beneath filled trench 48 can be readily determined. Furthermore, in many embodiments, the depth of filled trench 48 will be substantially known or will be measurable utilizing conventionally known means, such as atomic force microscopy or a stylus profiler technique. In such cases, the total thickness of metal level 38 can be determined by, for example, adding the thickness of the portion of IMD body 39 underlying filled trench 48 to the depth of filled trench 48. Additional characteristics pertaining to $M_2$ metal level 38, and more generally to BEOL layers 14, can also be determined when capacitor array 32 is formed to include additional columns of contacts (e.g., filled trenches or vias) as described more fully below in conjunction with FIG. 6.

Figure 5:
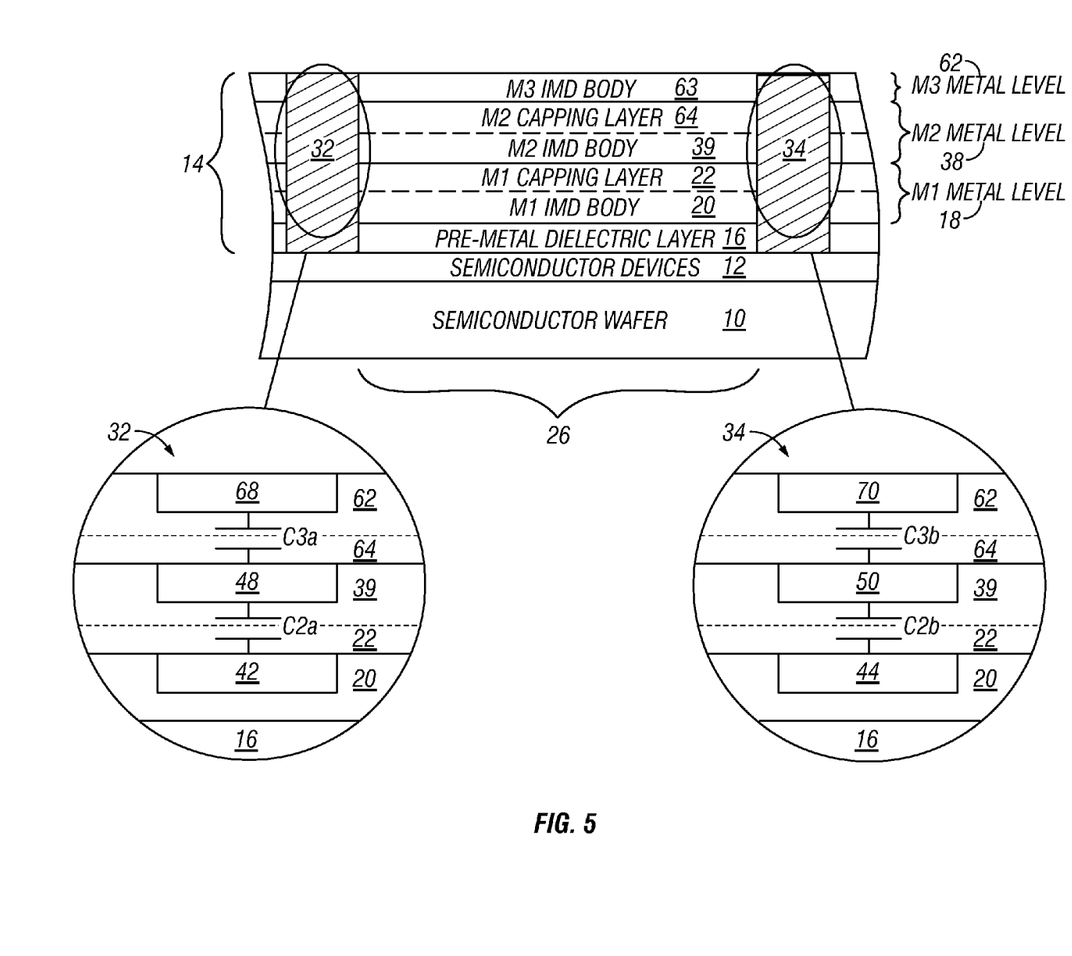
FIG. 5 is a simplified cross-sectional view of the semiconductor wafer shown in FIG. 1 after the formation of the metal interconnect lines included within the $M_3$ metal level and illustrating the first and second capacitor arrays in greater detail (again, shown in a partially completed state)

FIG. 5 is a simplified cross-sectional view of semiconductor wafer 10 immediately after the partial formation of an $M_3$ metal level 62 over an $M_2$ capping layer 64 included within $M_2$ metal level 38 and formed over $M_2$ IMD body 39. It will be noted that, in FIG. 5, $M_3$ metal level 62 is illustrated after chemical mechanical planarization and prior to capping. Thus, in FIG. 5, a first IMD layer (identified as "$M_3$ IMD body 63") has been deposited over $M_2$ metal level 38, and metal interconnect lines (not shown) have been formed in $M_3$ IMD body 63 via patterning, metal deposition, and CMP processing as previously described. In accordance with monitoring method 40 (FIG. 2), BEOL layers 14 are formed to include capacitor arrays 32 and 34 (shown in a partially completed state in FIG. 5). As indicated in FIG. 5, at least a third contact in the capacitor array is formed in the metal level overlying the second contact (STEP 66, FIG. 2). Thus, with respect to capacitor array 32, a third filled trench 68 is formed in $M_3$ metal level 62 overlying second filled trench 48; and, with respect to capacitor array 34, a third filled trench 70 is formed in $M_3$ metal level 62 overlying over second filled trench 50.

Addressing capacitor array 32, specifically, a second iteration of metrological sub-process 52 is performed to measure the interlayer capacitance ($C_{3a}$) between third filled trench 68 and second filled trench 48. The interlayer capacitance between filled trenches 68 and 48 is then converted to a contact-to-contact distance utilizing a pre-established calibration curve, and at least one characteristic pertaining to $M_3$ metal level 62 (e.g., a thickness of IMD body 63) is determined utilizing the contact-to-contact distance in the manner described above. In the illustrated example, the dimensions of third filled trench 68 are substantially identical to the dimensions of filled trenches 48 and 42; thus, the same calibration curve utilized to convert the interlayer capacitance between second filled trench 48 and first filled trench 42 (e.g., calibration curve 58 shown in FIG. 4) can be utilized to convert the interlayer capacitance measured between third filled trench 68 and second filled trench 48. Metrological sub-process 52 is likewise performed for capacitor array 34 in essentially the same manner to determine the contact-to-contact distance between filled trench 70 and filled trench 50 and the thickness of $M_3$ metal level 62 at capacitor array 34 (or other desired BEOL layer characteristic).

Finally, at STEP 72 of BEOL layer monitoring method 40 (FIG. 2), additional contacts (e.g., filled trenches) are formed in the above-described manner in subsequent metal level to complete capacitor array 32 and capacitor array 34. An iteration of metrological sub-process 52 is performed after the formation of each new contact in capacitor array 32 and capacitor array 34 to monitor the desired characteristic or characteristics for each newly-formed metal level. Notably, performing BEOL layer monitoring method 40 for multiple capacitors arrays (e.g., capacitor array 32 and capacitor array 34) enables the characteristics-of-interest to be measured at different locations across semiconductor wafer 10. For example, by measuring layer thickness at capacitor array 32 and at capacitor array 34, the uniformity of layer thickness across wafer 10 can be monitored. Furthermore, as noted above, the variance between the dielectric constant at array 32 and array 34 can be back calculated when the upper and lower surface areas of the filled trenches included within capacitor array 32 (e.g., filled trenches 42, 48, and 68) are different than the upper and lower surfaces areas of the filled trenches included within capacitor array 34 (e.g., filled trenches 44, 50, and 70). To further emphasize this point, FIG. 4 illustrates a second calibration curve 74 in addition to calibration curve 58 described above. Calibration curve 74 represents the interlayer capacitance (vertical axis) versus the distance between overlying pairs of contacts in capacitor array 34 (horizontal axis), wherein each of the filled trenches in array 34 has a predetermined surface area ($A_2$) greater than the predetermined surface area ($A_1$) of the filled trenches in array 32. First and second calibration curves 58 and 74 are expressed by Equations 1 and 2, respectively, below.

$$y_1 = \ln(\epsilon_0 \epsilon_{r1} A_1) \qquad \text{EQ. 1}$$

$$y_2 = \ln(\epsilon_0 \epsilon_{r2} A_2) \qquad \text{EQ. 2}$$

wherein $\epsilon_o$ is the permittivity constant; $\epsilon_{r1}$ and $\epsilon_{r2}$ are the dielectric characteristics of the insulative material utilized to form the intermetal dielectric material at capacitor array 32 and at capacitor array 34, respectively; and $A_1$ and $A_2$ are the predetermined surface areas of the contacts within capacitor array 32 and 34, respectively. Equations 1 and 2 can be combined to yield Equation 3.

$$\ln(\varepsilon_0 \varepsilon_{r1} A_1) - \ln(\varepsilon_0 \varepsilon_{r2} A_2) = \ln\left(\frac{\varepsilon_{r1}}{\varepsilon_{r2}} \cdot \frac{A_1}{A_2}\right) \qquad \text{EQ. 3}$$

As explained above, the surface area of each of the filled trenches included within contact array 32 is predetermined, as is the surface area of each of the trenches included within contact array 34. Consequently, $A_1$ and $A_2$ are known. Furthermore, the values on the left side of Equation 3 are measured during monitoring method 40 via the performance of metrological sub-process 52 for capacitor arrays 32 and 34 as described above. Equation 3 can thus be solved for the remaining variable ratio (i.e., $\epsilon_{r1}/\epsilon_{r2}$), as desired, to determine the ratio of the dielectric constant at capacitor array 32 over the dielectric constant at capacitor array 34. In this manner, capacitor arrays 32 and 34 can be utilized to determine the variance in dielectric constant over selected portions of semiconductor wafer 10.

Figure 6:
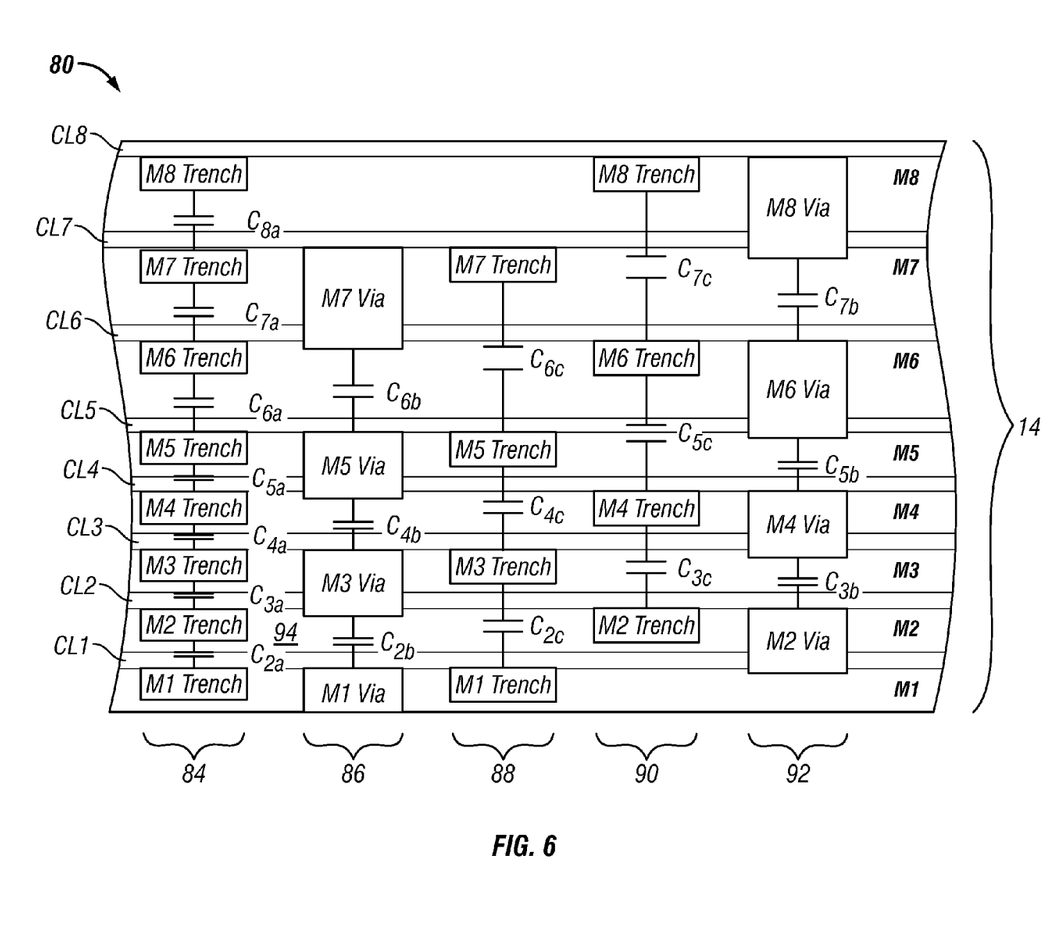
FIG. 6 is a simplified cross-sectional view of a third capacitor array that can be formed within the BEOL layers of the semiconductor wafer shown in FIG. 1 in accordance with a further embodiment.

The foregoing has thus provided at least one exemplary embodiment of a method for monitoring BEOL layer characteristics that can be performed in-line without the need for a separate metrology step or tool set. The exemplary BEOL layer monitoring method was described above in conjunction with two capacitor arrays (e.g., capacitor arrays 32 and 34 shown in FIGS. 1, 3, and 5) utilized to monitor layer thickness and the variance in dielectric constant across wafer 10. In the above-described example, capacitor arrays 32 and 34 each included a single column of filled trenches formed in successive metal levels; however, in further embodiments of the BEOL layer monitoring method, the capacitor arrays may include multiple columns of contacts (e.g., filled trenches or vias) formed in or through selected metal levels to enable additional characteristics pertaining to the BEOL layers to be monitored (e.g., via over-etch depth) and to increase the confidence level of the above-described monitored characteristics (e.g., layer thickness). In this regard, FIG. 6 is a simplified cross-sectional view of a multi-column capacitor array 80 that can be formed in BEOL layers 14 of semiconductor wafer 10 (FIG. 1) in lieu of, or in addition to, capacitor array 32 and/or capacitor array 34. In the exemplary embodiment illustrated in FIG. 6, BEOL layers 14 include eight metal levels $M_1$-$M_8$ including eight capping layers $CL_1$-$CL_8$; however, the number of BEOL layers 14 will inevitably vary amongst different embodiments and, in many cases, may include twelve or more metal levels. Metal levels $M_1$-$M_8$ are formed utilizing known processes and known materials as previously described.

Capacitor array 80 includes a number of conductive (e.g., copper) contacts formed at selected locations and in selected ones of BEOL layers 14. As illustrated in FIG. 6, the contacts of capacitor array 80 are created in selected BEOL layers 14 to form a plurality of contact columns 84, 86, 88, 90, and 92, which are laterally spaced apart at predetermined intervals. Each contact column thus includes a number of overlying, capacitively-coupled contacts. In the illustrated example, contact column 84 includes eight overlying filled trenches, which are formed in successive ones of metal levels $M_1$-$M_8$ and are consequently identified in FIG. 6 as an "$M_8$ filled trench," an "$M_7$ filled trench," an "$M_6$ filled trench," and so on. Contact column 86 includes four overlying vias, which each extend through an upper metal level and into a lower metal level. The vias of contact column 86 are identified in FIG. 6 by the metal level through which the via extends. Thus, the via extending through the $M_7$ metal level and into the $M_6$ metal level, is identified as the "$M_7$ via" in FIG. 6; the via extending through the $M_5$ metal level and into the $M_4$ metal level is identified as the "$M_5$ via"; and so on. Contact column 88 includes overlying four filled trenches, which are formed in a first set of alternating metal levels (i.e., $M_7$, $M_5$, $M_3$, and $M_1$). Similarly, contact column 90 includes four overlying filled trenches, which are formed in a second set of alternating metal levels (i.e., Mg, $M_6$, $M_4$, and $M_2$). The filled trenches within contact columns 88 and 90 are identified in the same manner as are the trenches of contact column 84. Thus, the uppermost filled trench within contact column 88 is referred to as the "$M_7$ filled trench of contact column 88," while the uppermost filled trench within contact column 90 is referred to as the "$M_8$ filled trench of contact column 90." Lastly, contact column 92 includes four overlying vias, each of which extends through an upper metal level, through an underlying capping layer, and into a lower metal level. The vias included within contact column 92 are identified in FIG. 6 in the same manner as are the vias included within contact column 86. Thus, the uppermost via in contact column 92, which extends through the $M_8$ metal level and into the $M_7$ capping layer, is identified as the "$M_8$ via."

With the exception of the lowermost contact in each column, each of the contacts within contact columns 84, 86, 88, 90, and 92 is formed above an underlying contact. Thus, with reference to contact column 84, the $M_2$ filled trench generally overlies the $M_1$ filled trench, the $M_3$ filled trench generally overlies the $M_2$ filled trench, the $M_4$ filled trench generally overlies the $M_3$ filled trench, etc. Vertically adjacent pairs of contacts within each contact column are separated by one or more layers of intermetal dielectric material. A capacitor is consequently formed between each vertically adjacent pair of contacts within each contact column. The capacitors created by vertically adjacent pairs of contacts within each contact column are identified in FIG. 6 by the contact column and the metal level over which the capacitor is primarily formed. Thus, the capacitor formed between the $M_2$ filled trench and the $M_1$ filled trench of contact column 84 is identified in FIG. 6 as capacitor "$C_{2a}$"; the capacitor formed between the $M_1$ via and the $M_3$ via of contact column 86 is identified as capacitor "$C_{2b}$"; and the capacitor formed between the $M_1$ filled trench and the $M_3$ filled trench of contact column 88 is identified as capacitor "$C_{2c}$." By comparison, the capacitor formed between the $M_3$ filled trench and the $M_2$ filled trench of contact column 84 is identified in FIG. 6 as capacitor "$C_{3a}$."

In the exemplary embodiment illustrated in FIG. 6, the planform dimensions (i.e., width and length) of the contacts included within contact columns 84, 86, 88, 90, and 92 are substantially identical. Furthermore, the depth of each of the filled trenches included within contact columns 84, 88, and 90 is substantially equivalent, although it will be appreciated that some variation in trench depth may occur as a result of inaccuracies inherent in conventional trench-forming and filling processes. As indicated in FIG. 6, the height of the vias included within contact columns 86 and 92 will vary in relation to the thickness of the metal levels $M_1$-$M_8$, as well as the depth to which each via penetrates into the underlying metal level (commonly referred to as the "via over-etch").

BEOL layer monitoring method 40, described above in conjunction with FIG. 2, can be performed for each of contact columns 84, 86, 88, 90, and 92, as appropriate. In particular, metrological sub-process 52 can be performed for each newly-formed contact in columns 84, 86, 88, 90, and 92, subsequent to the formation of the first contact in each column. Thus, after CMP processing of the $M_2$ metal level, metrological sub-process 52 can be performed for each of the contacts exposed through the upper surface of the $M_2$ metal level; i.e., the $M_2$ filled trench in contact column 84, the $M_2$ filled trench in contact column 90, and the $M_2$ via in contact column 92. Similarly, after CMP processing of the $M_3$ metal level, metrological sub-process 52 can be performed for each of the contacts exposed through the upper surface of the $M_3$ metal level; i.e., the $M_3$ filled trench in contact column 84, the $M_3$ via in contact column 86, and the $M_3$ filled trench in contact column 88. The interlayer capacitance between each pair of overlying contacts is then converted to a contact-to-contact distance utilizing a calibration curve as previously described. A unique calibration curve can be generated for each contact column. However, in certain embodiments, multiple contact columns can share a single calibration curve. For example, contact columns 86 and 92 may share a single calibration curve if the dimensions of the contacts within columns 86 and 92 are substantially identical; and contact columns 88 and 90 may share a single calibration curve if the dimensions of the contacts within columns 88 and 90 are substantially identical.

By measuring interlayer capacitances between overlying contact pairs in multiple contact columns, the confidence level of the data can be increased. For example, utilizing exemplary capacitor array 80 shown in FIG. 6, three interlayer capacitances indicative of a thickness of the $M_2$ metal level can be measured: (i) the capacitance ($C_{2a}$) between the $M_2$ filled trench and the $M_1$ filled trench in contact column 84, (ii) the capacitance ($C_{2b}$) between the $M_3$ via and the $M_1$ via in contact column 86, and (iii) the capacitance ($C_{2c}$) between the $M_3$ filled trench and the $M_1$ filled trench in contact column 88. Furthermore, different sets of measured interlayer capacitances can be utilized to determine additional characteristics pertaining to BEOL layers 14, such as via over-etch depth. As a specific example, if the over-etch depth of the $M_3$ via in contact column 86 is unknown, the over-etch depth of the $M_3$ via can be determined in the following manner. First, the distance between the $M_3$ via and the $M_1$ via is determined utilizing the measured interlayer capacitance ($C_{2b}$) and a corresponding calibration curve similar to calibration curves 58 and 74 shown in FIG. 4. Second, the thickness of the IMD body of $M_2$ metal level (identified in FIG. 6 at 94) is determined utilizing the interlayer capacitance ($C_{2a}$) between the $M_2$ filled trench and the $M_1$ filled trench in contact column 84 and/or the interlayer capacitance ($C_{2c}$) between the $M_3$ filled trench and the $M_1$ filled trench in contact column 88 in the previously described manner (again, noting that the thickness of capping layer $CL_1$ is generally known). Lastly, the distance between the $M_3$ via and the $M_1$ via is deducted from the thickness of the IMD body of the $M_2$ metal level to yield the over-etch depth of the $M_3$ via included in contact column 86.

There has thus been provided multiple exemplary embodiments of a BEOL layer monitoring method suitable for monitoring layer thickness and other characteristics (e.g., variance in dielectric constant and/or via over-etch depth) pertaining to BEOL layers formed during the back end-of-the-line processing. Notably, embodiments of the above-described BEOL layer monitoring method can be reliably performed in-line utilizing conventional electrical test equipment thereby eliminating the need for a separate tool set and minimizing CMP-to-capping time delay. Embodiments of the above-described monitoring method to be compatible with ultra low-k IMD materials and semiconductor nodes equal to or less than 22 nm.

As indicated above, embodiments of the BEOL layer monitoring method are well-suited for use in conjunction with process development. In this regard, embodiments of the monitoring method can be performed on test wafers to generate design parameters for subsequent production wafers. In this case, the BEOL layer monitoring method can be subsumed within a method for manufacturing an integrated circuit, which may include the following steps: (i) providing a semiconductor wafer, (ii) fabricating semiconductor devices on the wafer, and (iii) forming a first plurality of back end-of-the-line (BEOL) layers interconnecting the semiconductor devices and in accordance with a design parameter previously determined the above-described BEOL layer monitoring method. Furthermore, during the step of forming, at least one process parameter can be adjusted in response to the determined distance between first and second overlying contacts as determined utilizing the conversion process described above in conjunction with STEP 56 of monitoring method 40 (FIG. 2).

Embodiments of the monitoring method can also be performed on production wafers, in which case it is preferred that the capacitor array or arrays are formed, at least partially, in the kerf areas (e.g., kerf areas 28 and 30 shown in FIG. 1). In such cases, the BEOL layer monitoring method may be included within a method for manufacturing a plurality of integrated circuits on a production semiconductor wafer, which includes the steps of: (i) fabricating semiconductor devices on the production semiconductor wafer, (ii) forming a plurality of back end-of-the-line (BEOL) layers interconnecting the semiconductor devices, and (iii) monitoring a first characteristic pertaining to the BEOL layers at a plurality of sites on the semiconductor wafer, wherein the step of monitoring is accomplished via the implementation of an embodiment of the BEOL layer monitoring method described above.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended Claims and the legal equivalents thereof. Numerical identifiers, such as "first," "second," "third," and the like have been used above in accordance with the order in which elements (e.g., contacts) were introduced during the course of the foregoing Detailed Description. Such numerical identifiers are also used in the subsequent Claims to indicate order of introduction in the Claims. Accordingly, numerical identifiers may vary between the Detailed Description and the subsequent Claims to reflect differences in the order of introduction.

What is claimed is:

1. A method for monitoring at least one characteristic pertaining to a plurality of back end-of-the-line (BEOL) layers, the method comprising:
   forming a first capacitor array within the plurality of BEOL layers including first and second overlying contacts each formed in a different one of the plurality of BEOL layers;
   measuring the interlayer capacitance between the first and second overlying contacts; and
   converting the measured interlayer capacitance to a distance between the first and second overlying contacts, wherein converting the measured interlayer capacitance to a distance between the first and second overlying contacts is performed using a pre-established function, the pre-established function being determined prior to said converting, wherein the pre-established function is determined using one or more of empirical data and constitutive equations, and wherein the pre-established function describes the interlayer capacitance versus the distance between the first and second overlying contacts of the first capacitor array.

2. A method according to claim 1 further comprising the step of establishing a first calibration curve as the pre-established function describing distance versus interlayer capacitance between the first and second overlying contacts.

3. A method according to claim 2 wherein the step of converting comprises utilizing the first calibration curve to convert the measured interlayer capacitance to a distance between the first and second overlying contacts.

4. A method according to claim 3 wherein the plurality of BEOL layers includes a first metal level and a second metal level formed over the first metal level, and wherein the step of forming a first capacitor array comprises:
   forming a first filled trench in the first metal level; and
   forming a second filled trench in the second metal level and overlying the first filled trench.

5. A method according to claim 4 further comprising the step of determining a thickness of the second metal level based at least partially upon the depth of the second filled trench and the distance between the first filled trench and the second filled trench.

6. A method according to claim 4 wherein the plurality of BEOL layers further includes a third metal level formed over the second metal level, and wherein the method further includes the steps of:
   forming a third filled trench in the first metal level; and
   forming a fourth filled trench in the third metal level and overlying the third filled trench.

7. A method according to claim 6 further comprising the steps of:
   establishing a second calibration curve describing distance versus interlayer capacitance between the third filled trench and the fourth filled trench;
   measuring the interlayer capacitance between the third filled trench and the fourth filled trench; and
   utilizing the second calibration curve to convert the measured interlayer capacitance to a distance between the third filled trench and the fourth filled trench.

8. A method according to claim 7 further comprising the step of determining a thickness of the second metal level based at least partially upon the distance between the first filled trench and the second filled trench and the distance between the third filled trench and the fourth filled trench.

9. A method according to claim 4 wherein the plurality of BEOL layers further includes a third metal level formed over the second metal level, and wherein the method further comprises the steps of:
   forming a first via extending through the first metal level; and
   forming a second via extending through the third metal level and into the second metal level.

10. A method according to claim 9 further comprising the steps of:
    establishing a second calibration curve describing distance versus interlayer capacitance between the first via and the second via;
    measuring the interlayer capacitance between the first via and the second via; and
    utilizing the second calibration curve to convert the measured interlayer capacitance to a distance between the first via and the second via.

11. A method according to claim 10 further comprising the step of determining the over-etch depth of the second via as a function of the distance between the first via and the second via.

12. A method according to claim 3 further comprising the steps of:
    planarizing the second metal level; and
    forming a capping layer over the second metal level, the step of measuring performed after the step of planarizing and prior to the step of forming a capping layer.

13. A method according to claim 4 further comprising the step of forming a second capacitor array within the plurality of BEOL layers and spaced apart from the first capacitor array, the second capacitor array including third and fourth filled trenches formed in the first metal level and in the second metal level, respectively.

14. A method according to claim 13 wherein the step of forming a first capacitor array comprises forming the first filled trench and the second filled trench each having a first predetermined surface area, and wherein the step of forming a second capacitor array comprises forming the third filled trench and the fourth filled trench each having a second predetermined surface area different than the first predetermined surface area.

15. A method according to claim 14 further comprising the steps of:
    measuring the interlayer capacitance between the third and fourth filled trenches; and
    calculating a ratio representative of a dielectric constant between the first and second filled trenches relative to a dielectric constant between the third and fourth filled trenches as a function of the measured interlayer capacitance between the first and second filled trenches, the measured interlayer between the first and second filled trenches, the first predetermined surface area, and the second predetermined surface area.

16. A method for manufacturing a plurality of integrated circuits on a semiconductor wafer, comprising:
    fabricating semiconductor devices on the semiconductor wafer;
    forming a plurality of back end-of-the-line (BEOL) layers interconnecting the semiconductor devices; and
    monitoring a first characteristic pertaining to the BEOL layers at a plurality of sites on the semiconductor wafer, the step of monitoring comprising:
       forming first and second overlying contacts each in a different one of the plurality of BEOL layers;
       measuring the interlayer capacitance between the first and second overlying contacts; and converting the measured interlayer capacitance to a distance between the first and second overlying contacts, wherein converting the measured interlayer capacitance to a distance between the first and second overlying contacts is performed using a pre-established function, the pre-established function being determined prior to said converting, wherein the pre-established function is determined using one or more of empirical data and constitutive equations, and wherein the pre-established function describes the interlayer capacitance versus the distance between the first and second overlying contacts of the first capacitor array.

17. A method according to claim 16 wherein the semiconductor wafer includes a kerf area, and wherein the step of forming comprises forming first and second overlying contacts at least partially in the kerf area.

18. A method for manufacturing an integrated circuit, comprising:
    providing a semiconductor wafer;
    fabricating semiconductor devices on the wafer; and
    forming a first plurality of back end-of-the-line (BEOL) layers interconnecting the semiconductor devices and in accordance with a design parameter previously determined by the steps comprising: (i) forming a second plurality of BEOL layers on test wafer; (ii) forming first and second overlying contacts each in a different one of the second plurality of BEOL layers; (iii) measuring the interlayer capacitance between the first and second overlying contacts; and (iv) converting the measured interlayer capacitance to a distance between the first and second overlying contacts, wherein converting the measured interlayer capacitance to a distance between the first and second overlying contacts is performed using a pre-established function, the pre-established function being determined prior to said converting, wherein the pre-established function is determined using one or more of empirical data and constitutive equations, and wherein the pre-established function describes the interlayer capacitance versus the distance between the first and second overlying contacts of the first capacitor array.

19. A method according to claim 18 wherein the step of converting further comprises:
    establishing a calibration curve as the pre-determined function describing distance versus interlayer capacitance for the first and second overlying contacts; and
    determining the distance between the first and second contacts utilizing the calibration curve.

20. A method according to claim 19 further comprising the step of determining the thickness of a layer included within the plurality of BEOL layers based at least partially upon the depth of the first contact and the distance between the first and second contacts.

* * * * *

UNITED STATES PATENT AND TRADEMARK OFFICE
CERTIFICATE OF CORRECTION

PATENT NO.       : 8,241,927 B2                                   Page 1 of 1
APPLICATION NO.  : 12/579216
DATED            : August 14, 2012
INVENTOR(S)      : Jihong Choi et al.

It is certified that error appears in the above-identified patent and that said Letters Patent is hereby corrected as shown below:

In claim 9, column 14, line 2, insert a space between the words "of" and "BEOL".

In claim 16, column 14, line 59, insert a space between the words "of" and "back".

Signed and Sealed this
Twelfth Day of February, 2013

Teresa Stanek Rea
*Acting Director of the United States Patent and Trademark Office*